United States Patent
Pei et al.

(10) Patent No.: US 9,076,817 B2
(45) Date of Patent: Jul. 7, 2015

(54) EPITAXIAL EXTENSION CMOS TRANSISTOR

(75) Inventors: Chengwen Pei, Danbury, CT (US); Geng Wang, Stormville, NY (US); Yanli Zhang, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 73 days.

(21) Appl. No.: 13/198,152

(22) Filed: Aug. 4, 2011

(65) Prior Publication Data

US 2013/0032859 A1 Feb. 7, 2013

(51) Int. Cl.
*H01L 29/66* (2006.01)
*H01L 29/51* (2006.01)

(52) U.S. Cl.
CPC ........... *H01L 29/6656* (2013.01); *H01L 29/517* (2013.01); *H01L 29/6653* (2013.01); *H01L 29/66545* (2013.01); *H01L 29/66628* (2013.01); *H01L 29/66636* (2013.01)

(58) Field of Classification Search
CPC ............... H01L 29/6653; H01L 29/66545; H01L 29/6656; H01L 29/66628; H01L 29/66636
USPC .................................. 257/190, 192, 327, 616
See application file for complete search history.

(56) References Cited

U.S. PATENT DOCUMENTS

| | | | |
|---|---|---|---|
| 5,508,539 A | 4/1996 | Gilbert et al. | |
| 6,232,191 B1 * | 5/2001 | Jeng et al. | 438/303 |
| 6,544,851 B2 | 4/2003 | Ponomarev et al. | |
| 6,906,360 B2 | 6/2005 | Chen et al. | |
| 6,946,696 B2 * | 9/2005 | Chan et al. | 257/250 |
| 7,176,481 B2 * | 2/2007 | Chen et al. | 257/19 |
| 7,291,898 B1 | 11/2007 | U'Ren | |
| 7,358,550 B2 * | 4/2008 | Nakabayashi et al. | 257/288 |
| 7,429,775 B1 | 9/2008 | Nayak et al. | |
| 7,446,350 B2 | 11/2008 | Chen et al. | |
| 7,462,545 B2 * | 12/2008 | Chou et al. | 438/300 |
| 7,462,923 B1 | 12/2008 | U'Ren | |
| 7,579,617 B2 * | 8/2009 | Shimamune et al. | 257/19 |
| 7,750,338 B2 * | 7/2010 | Wang | 257/19 |
| 7,795,703 B1 | 9/2010 | U'Ren | |

(Continued)

OTHER PUBLICATIONS

International Search Report, PCT/US2012/040067, Dec. 6, 2012.

(Continued)

*Primary Examiner* — Jay C Kim
(74) *Attorney, Agent, or Firm* — Scully, Scott, Murphy & Presser, P.C.; H. Daniel Schnurmann

(57) ABSTRACT

A pair of horizontal-step-including trenches are formed in a semiconductor layer by forming a pair of first trenches having a first depth around a gate structure on the semiconductor layer, forming a disposable spacer around the gate structure to cover proximal portions of the first trenches, and by forming a pair of second trenches to a second depth greater than the first depth. The disposable spacer is removed, and selective epitaxy is performed to form an integrated epitaxial source and source extension region and an integrated epitaxial drain and drain extension region. A replacement gate structure can be formed after deposition and planarization of a planarization dielectric layer and subsequent removal of the gate structure and laterally expand the gate cavity over expitaxial source and drain extension regions. Alternately, a contact-level dielectric layer can be deposited directly on the integrated epitaxial regions and contact via structures can be formed therein.

14 Claims, 8 Drawing Sheets

(56) References Cited

U.S. PATENT DOCUMENTS

| | | | |
|---|---|---|---|
| 8,093,634 B2 * | 1/2012 | Mowry et al. | 257/288 |
| 8,202,777 B2 * | 6/2012 | Kronholz et al. | 438/230 |
| 8,236,658 B2 * | 8/2012 | Kuan et al. | 438/299 |
| 8,269,255 B2 * | 9/2012 | Shin et al. | 257/190 |
| 8,466,502 B2 * | 6/2013 | Tsai et al. | 257/274 |
| 8,481,415 B2 * | 7/2013 | Yuan et al. | 438/585 |
| 8,685,847 B2 * | 4/2014 | Majumdar et al. | 438/517 |
| 2003/0234422 A1 | 12/2003 | Wang et al. | |
| 2005/0051851 A1 | 3/2005 | Chen et al. | |
| 2005/0199948 A1 | 9/2005 | Lee et al. | |
| 2006/0065939 A1 | 3/2006 | Doczy et al. | |
| 2006/0145273 A1 | 7/2006 | Curello et al. | |
| 2006/0231826 A1 * | 10/2006 | Kohyama | 257/19 |
| 2007/0034963 A1 * | 2/2007 | Sudo | 257/369 |
| 2007/0269952 A1 | 11/2007 | Chong et al. | |
| 2008/0067545 A1 * | 3/2008 | Rhee et al. | 257/190 |
| 2008/0283906 A1 * | 11/2008 | Bohr | 257/327 |
| 2012/0052646 A1 * | 3/2012 | Awano | 438/289 |
| 2012/0205716 A1 * | 8/2012 | Adam et al. | 257/192 |

OTHER PUBLICATIONS

Examination Report—Application No. GB1320434.2 dated Dec. 24, 2013.

Office Action dated Dec. 17, 2014 received in U.S. Appl. No. 13/777,353.

* cited by examiner

EPITAXIAL EXTENSION CMOS TRANSISTOR

BACKGROUND

The present disclosure generally relates to semiconductor devices, and particularly to complementary metal-oxide-semiconductor (CMOS) field effect transistors including epitaxial source and drain extension regions, and methods of manufacturing the same.

With scaling of semiconductor devices, the distribution of electrically active dopants in source and drain extension regions of a metal-oxide-semiconductor field effect transistor (MOSFET) is statistically determined. Further, the extent of the source and drain regions becomes more difficult to control with the reduction of lateral dimensions for the source and drain regions. Thus, the resistance of the source and drain regions is subjected to greater statistical variation, i.e., control of the resistance of source and drain extension regions becomes more difficult with the scaling.

However, the performance of a MOSFET is often critically dependent on the resistance of the source and drain extension regions. Specifically, high source or drain resistance in a MOSFET results in degradation in the on-current and the switching speed of the MOSFET. Thus, the resistance of the source and drain extension regions needs to be kept low in order to provide a high performance MOSFET.

Further, ion scattering effect that accompanies conventional ion implantation process employed to doped source and drain extension regions causes short channel effect (SCE) performance degradation in high performance MOSFETs. The stochastic nature of the path of the implanted electrical dopants (which are either p-type dopants or n-type dopants) causes the dopant concentration profile around interfaces between a body region of a MOSFET and source and drain extension regions of the MOSFET to vary gradually due to significant interdiffusion of electrical dopants between the body region and the source and drain extension regions, thereby exacerbating the short channel effect.

BRIEF SUMMARY

A pair of horizontal-step-including trenches are formed in a semiconductor layer by forming a pair of first trenches having a first depth around a gate structure on the semiconductor layer, forming a disposable spacer around the gate structure to cover proximal portions of the first trenches, and by forming a pair of second trenches to a second depth greater than the first depth. The disposable spacer is removed, and selective epitaxy is performed to form an integrated epitaxial source and source extension region and an integrated epitaxial drain and drain extension region. A replacement gate structure can be formed after deposition and planarization of a planarization dielectric layer and subsequent removal of the gate structure. Alternately, a contact-level dielectric layer can be deposited directly on the integrated epitaxial regions and contact via structures can be formed therein.

According to an aspect of the present disclosure, a semiconductor structure including a field effect transistor (FET) is provided. The semiconductor structure includes: a single crystalline body region located in a semiconductor substrate; and an integrated epitaxial diffusion region that is epitaxially aligned to the single crystalline body region at an interface including a first horizontal surface at a first depth from a top surface of the single crystalline body region and a second horizontal surface at a second depth from the top surface of the single crystalline body region, the second depth being greater than the first depth.

According to another aspect of the present disclosure, a method of forming a semiconductor structure is provided. The method includes: forming a gate structure on a semiconductor layer in a semiconductor substrate; forming a pair of first trenches having a first depth around the gate structure in the semiconductor layer; forming a disposable spacer around the gate structure to cover proximal portions of the first trenches; forming a pair of second trenches to a second depth greater than the first depth by recessing portions of the pair of first trenches that are not covered by the gate structure and the disposable spacer; removing the disposable spacer, wherein a pair of horizontal-step-including trenches are formed; and forming an integrated epitaxial source and source extension region and an integrated epitaxial drain and drain extension region by filling the pair of horizontal-step-including trenches with a doped semiconductor material.

DETAILED DESCRIPTION

Figure 1:
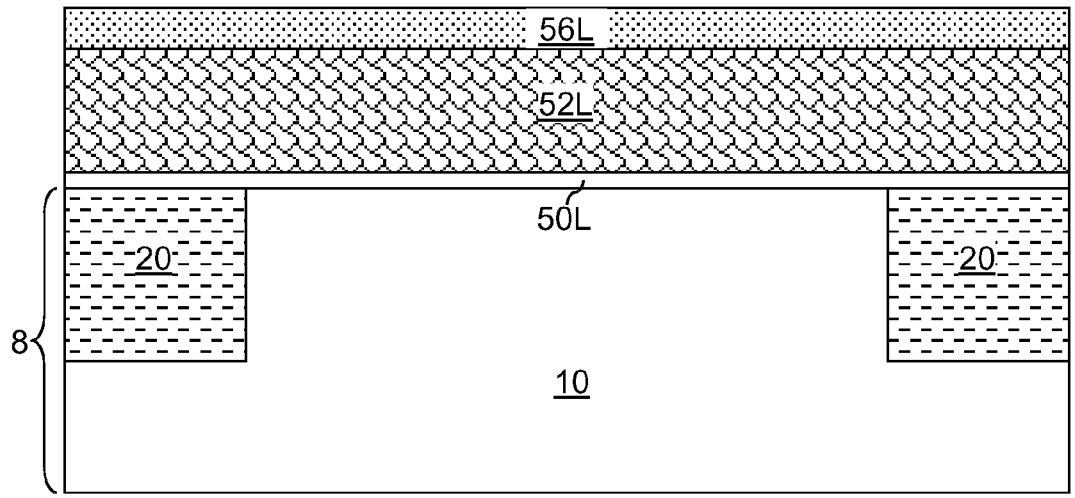
FIG. 1 is a vertical cross-sectional view of a first exemplary semiconductor structure after formation of gate stack layers according to a first embodiment of the present disclosure.

As stated above, the present disclosure relates to complementary metal-oxide-semiconductor (CMOS) field effect transistors including epitaxial source and drain extension regions, and methods of manufacturing the same, which are now described in detail with accompanying figures. It is noted that like reference numerals refer to like elements across different embodiments. The drawings are not necessarily drawn to scale. The drawings are not necessarily drawn to scale.

Referring to FIG. 1, a first exemplary semiconductor structure according to a first embodiment of the present disclosure includes a substrate 8 and gate stack layers formed thereupon. The substrate 8 can be a semiconductor-on-insulator (SOI) substrate or a bulk semiconductor substrate. The substrate 8 includes a single crystalline semiconductor region 10, which is a region of a single crystalline semiconductor material.

The single crystalline semiconductor region 10 can be a top semiconductor layer of an SOI substrate or a bulk semiconductor substrate. The single crystalline semiconductor region 10 has a p-type doping or n-type doping. The conductivity type of the doping of the single crystalline semiconductor region 10 is herein referred to as a first conductivity type. Shallow trench isolation structures 20 including a dielectric material can be formed in the substrate 8 to provide electrical isolation between neighboring semiconductor devices to be formed.

The gate stack layers can include a stack, from bottom to top, of a gate dielectric layer 50L, a gate conductor layer 52L, and a gate cap dielectric layer 56L. The gate stack layers (50L, 52L, 56L) can be "blanket" layers, i.e., unpatterned planar layers, each having a uniform thickness throughout.

The gate dielectric layer 50L includes a dielectric material, which can be silicon oxide, silicon nitride, silicon oxynitride, or a stack thereof. Alternately, the gate dielectric layer 50L can be a high dielectric constant (high-k) material layer having a dielectric constant greater than 8.0. In one embodiment, the gate dielectric layer 50L can include a dielectric metal oxide, which is a high-k material containing a metal and oxygen, and is known in the art as high-k gate dielectric materials. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), etc. Exemplary high-k dielectric material include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y2O_xN_y$, a silicate thereof, and an alloy thereof. Each value of x is independently from 0.5 to 3 and each value of y is independently from 0 to 2. The thickness of the gate dielectric layer 50L can be from 0.9 nm to 6 nm, although lesser and greater thicknesses can also be employed.

The gate conductor layer 52L includes a conductive material, which can be a doped semiconductor material, a metallic material, or a combination thereof. The doped semiconductor material, if present, can be doped polysilicon, doped polycrystalline germanium, a doped silicon-germanium alloy, any other doped elemental or compound semiconductor material, or a combination thereof. The metallic material, if present, can be any metallic material that can be deposited by chemical vapor deposition (CVD), physical vapor deposition (PVD), or a combination thereof. For example, the metallic material can include aluminum and/or tungsten. The thickness of the gate conductor layer 52L can be from 30 nm to 500 nm, although lesser and greater thicknesses can also be employed.

The gate cap dielectric layer 56L includes a dielectric material such as silicon nitride, silicon oxide, organosilicate glass (OSG), a high dielectric constant (high-k) material layer that can be employed for the gate dielectric layer 50L, or a combination thereof. The gate cap dielectric layer 56L can be deposited, for example, by chemical vapor deposition or by any other deposition method known in the art. The thickness of the gate cap dielectric layer 56L can be from 10 nm to 200 nm, and typically from 20 nm to 100 nm, although lesser and greater thicknesses can also be employed.

Figure 2:
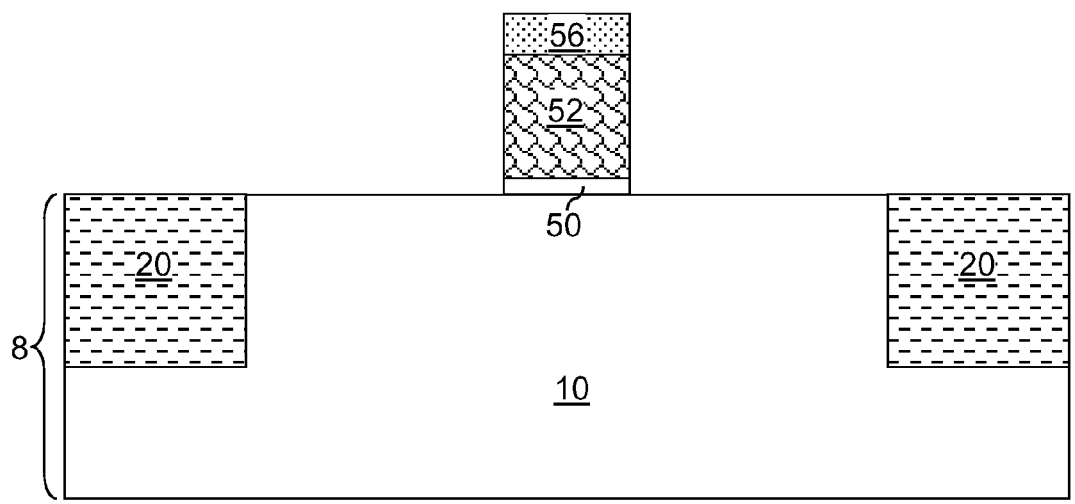
FIG. 2 is a vertical cross-sectional view of the first exemplary semiconductor structure after formation of a gate structure according to the first embodiment of the present disclosure.

Referring to FIG. 2, a gate stack is formed by patterning the gate stack layers (50L, 52L, 56L). Specifically, the gate stack layers (50L, 52L, 56L) can be patterned by an anisotropic etch process employing a patterned photoresist (not shown) as a masking layer.

The remaining portion of the gate cap dielectric layer 56L is a gate cap dielectric 56. The remaining portion of the gate conductor layer 52L is a gate conductor 52. The remaining portion of the gate dielectric layer 50L is a gate dielectric 50. The gate stack includes the gate cap dielectric 56, the gate conductor 52, and the gate dielectric 50. The sidewalls of the gate conductor 52 are vertically coincident, i.e., coincide in a top down view along a direction perpendicular to the top surface of the semiconductor substrate 8, with the sidewalls of the gate cap dielectric 56 and with the sidewalls of the gate dielectric 50.

Figure 3:
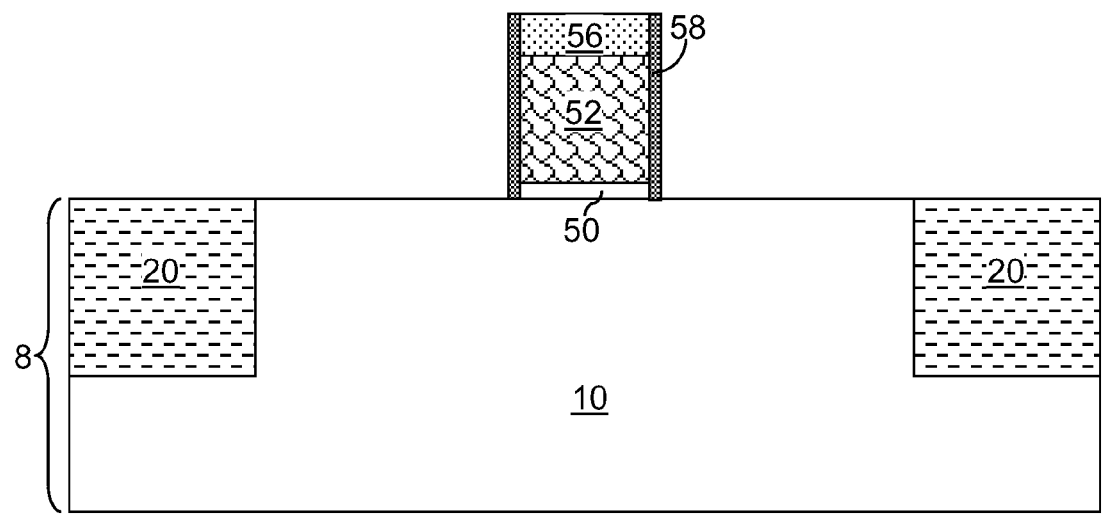
FIG. 3 is a vertical cross-sectional view of the first exemplary semiconductor structure after formation of a gate spacer according to the first embodiment of the present disclosure.

Referring to FIG. 3, a gate spacer 58 is formed by deposition of a dielectric material layer and an anisotropic etch that removes horizontal portions of the dielectric material layer. The remaining vertical portions of the dielectric material layer constitute the gate spacer 58. The gate spacer 58 includes a dielectric material such as silicon oxide, silicon nitride, silicon oxynitride, or a combination thereof. In one embodiment, the dielectric material layer can be a conformally deposited, i.e., with a same thickness at vertical portions and at horizontal portions. In another embodiment, the dielectric material layer can be formed by conversion of surface portions of a semiconductor material at the sidewalls of the gate conductor 52, for example, by thermal oxidation, thermal nitridation, plasma oxidation, plasma nitridation, or a combination thereof.

The width of the gate spacer 58, as measured at the base contacting the substrate 8, can be from 2 nm to 30 nm, although lesser and greater thicknesses can be employed. The combination of the gate stack (50, 52, 56) and the gate spacer 58 constitutes a gate structure.

Figure 4:
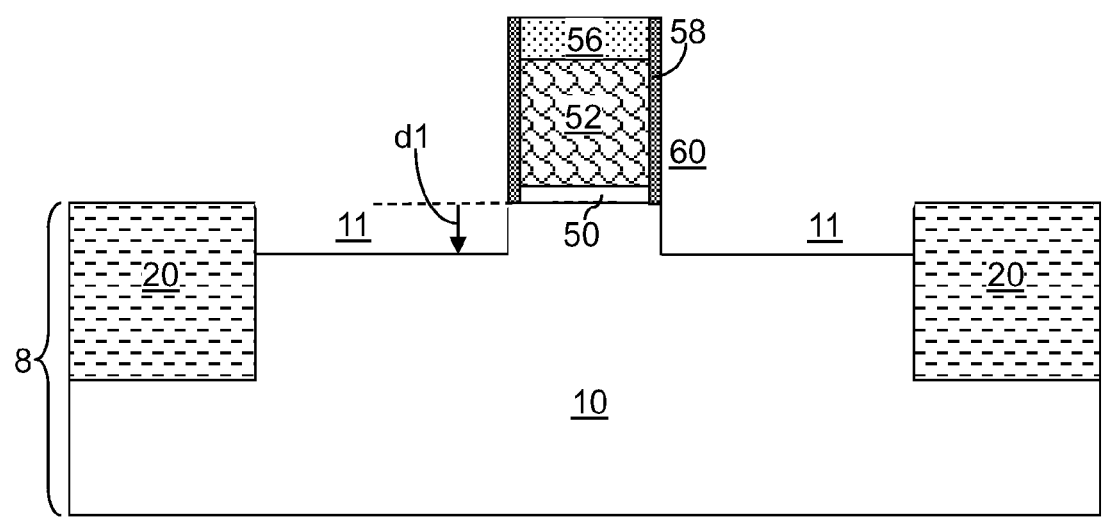
FIG. 4 is a vertical cross-sectional view of the first exemplary semiconductor structure after formation of a pair of first trenches according to the first embodiment of the present disclosure.

Referring to FIG. 4, a pair of first trenches 11 is formed by recessing the semiconductor material in the single crystalline semiconductor region 10 employing the combination of the gate structure (50, 52, 56, 58) and the shallow trench isolation structures 20 as an etch mask. The pair of first trenches 11 extends from the top surface of the single crystalline semiconductor region 10 to a first depth d1, which can be from 3 nm to 100 nm, although lesser and greater first depths d1 can also be employed. The etching of the semiconductor material proceeds uniformly across the substrate 8 so that the pair of first trenches 11 has planar bottom surfaces.

The recessing of the exposed top surfaces of the single crystalline semiconductor region 10 can be performed by an anisotropic etch such as a reactive ion etch. In this case, the sidewalls of each first trench 11 can be vertical. The vertical sidewalls of the pair of first trenches 11 are vertically coincident with outer sidewalls of the gate spacer 58. The vertical sidewalls of the pair of first trenches 11 are adjoined to the outer sidewalls of the gate spacer 58 at an upper end, and are adjoined to the horizontal bottom surface of the pair of first trenches 11 at a lower end.

Figure 5:
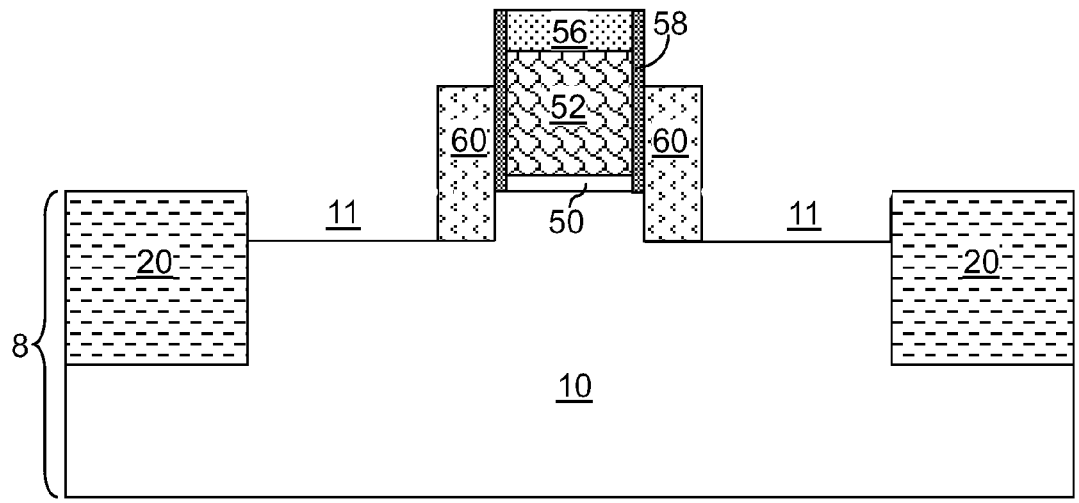
FIG. 5 is a vertical cross-sectional view of the first exemplary semiconductor structure after formation of a disposable spacer according to the first embodiment of the present disclosure.

Referring to FIG. 5, a disposable spacer 60 is formed on the outer sidewalls of the gate spacer 58 by conformal deposition of a disposable material layer and an anisotropic etch that removes horizontal portions of the disposable material layer. The remaining vertical portions of the disposable material layer constitute the disposable spacer 60.

In one embodiment, the anisotropic etch is selective to the semiconductor material of the single crystalline semiconductor region 10, and the anisotropic etch continues after removal of horizontal portions of the disposable material layer until vertical portions of the disposable material layer are removed around the shallow trench isolation structures 20.

The disposable material layer includes a material that can be removed selective to the materials of the gate spacer 58, the gate cap dielectric 56, and the single crystalline semiconductor region 10. In one embodiment, the material of the dielectric material layer can be removed selective to the material of the shallow trench isolation structures as well. In one embodiment, the disposable material layer can include a semiconductor material such as germanium or a silicon germanium alloy including germanium at an atomic concentration greater then 20%. In another embodiment, the disposable material layer can include a dielectric material such as organosilicate glass or other porous or non-porous dielectric materials that are different from the dielectric materials of the gate spacer 58 and the gate cap dielectric 56. In a first example, the shallow trench isolation structures 20, the gate cap dielectric 56, and the gate spacer 58 can include silicon oxide and/or silicon nitride, and the disposable material layer can include organosilicate glass. In a second example, the shallow trench isolation structures 20, the gate cap dielectric 56, and the gate spacer 58 can include silicon oxide, and the disposable material layer can include silicon nitride, or vice versa.

The width of the disposable spacer 60, as measured at the base contacting the bottom surface of the first trenches 11, can be from 5 nm to 100 nm, although lesser and greater widths can also be employed.

Figure 6:
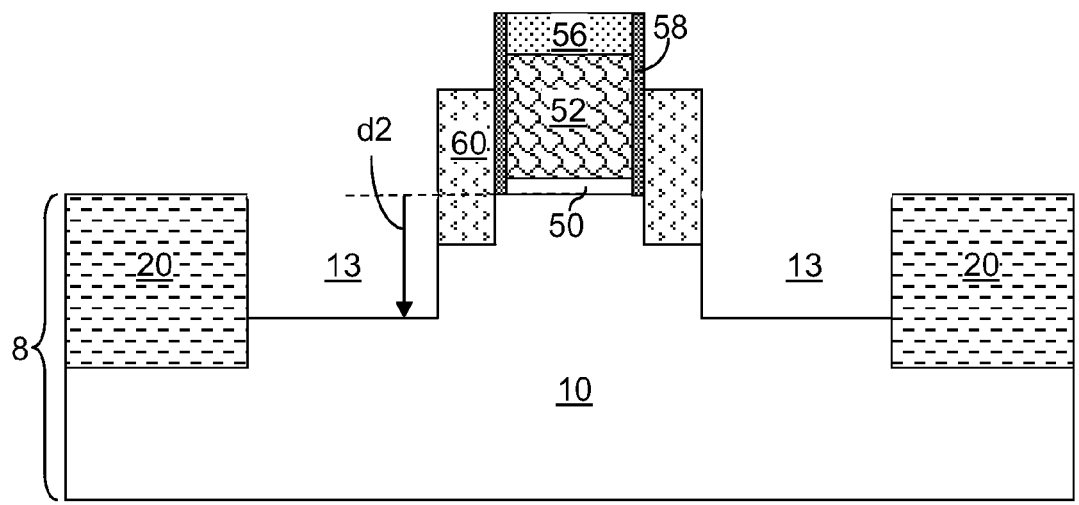
FIG. 6 is a vertical cross-sectional view of the first exemplary semiconductor structure after formation of a pair of second trenches according to the first embodiment of the present disclosure.

Referring to FIG. 6, a pair of second trenches 13 is formed by recessing the semiconductor material in the single crystalline semiconductor region 10 employing the combination of the gate structure (50, 52, 56, 58), the shallow trench isolation structures 20, and the disposable spacer 60 as an etch mask. The pair of second trenches 13 extends from the top surface of the single crystalline semiconductor region 10 to a second depth d2, which can be from 5 nm to 300 nm, although lesser and greater second depths d2 can also be employed.

The etching of the semiconductor material proceeds uniformly across the substrate 8 so that the pair of second trenches 11 has planar bottom surfaces. The second depth d2 is greater than the first depth d1.

The recessing of the exposed top surfaces of the single crystalline semiconductor region 10 can be performed by an anisotropic etch such as a reactive ion etch. In this case the sidewalls of each second trench 13 can be vertical. The vertical sidewalls of the pair of second trenches 13 are vertically coincident with outer sidewalls of the disposable spacer 60. The vertical sidewalls of the pair of second trenches 13 are adjoined to the outer sidewalls of the disposable spacer 60 at an upper end, and are adjoined to the horizontal bottom surface of the pair of second trenches 13 at a lower end.

Figure 7:
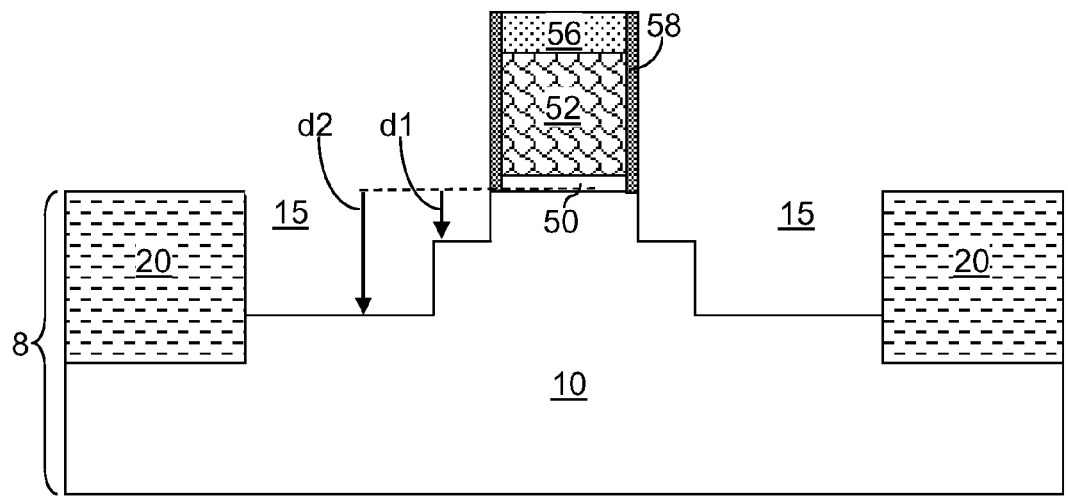
FIG. 7 is a vertical cross-sectional view of the first exemplary semiconductor structure after formation of a pair of horizontal-step-including trenches according to the first embodiment of the present disclosure.

Referring to FIG. 7, the disposable spacer 60 is removed selective to exposed surfaces of the gate structure (50, 52, 56, 58), i.e., selective to the gate cap dielectric 56, the gate spacer 58. Optionally, the removal of the disposable gate spacer 60 can be selective to the shallow trench isolation structures 20. Upon removal of the disposable spacer 60, a pair of horizontal-step-including trenches 15 is formed within the substrate 8.

Each horizontal-step-including trench 15 has a first vertical sidewall extending from an bottommost portion of the outer sidewalls of the gate spacer 58 to the first depth d1 into the substrate 8, a first horizontal surface that is located at the first depth d1, a second vertical sidewall extending from the first depth d1 to the second depth d2, and a second horizontal surface located at the second depth d2. The first vertical sidewalls of the pair of horizontal-step-including trenches 15 are vertically coincident with the outer sidewalls of the gate spacer 58.

Figure 8:
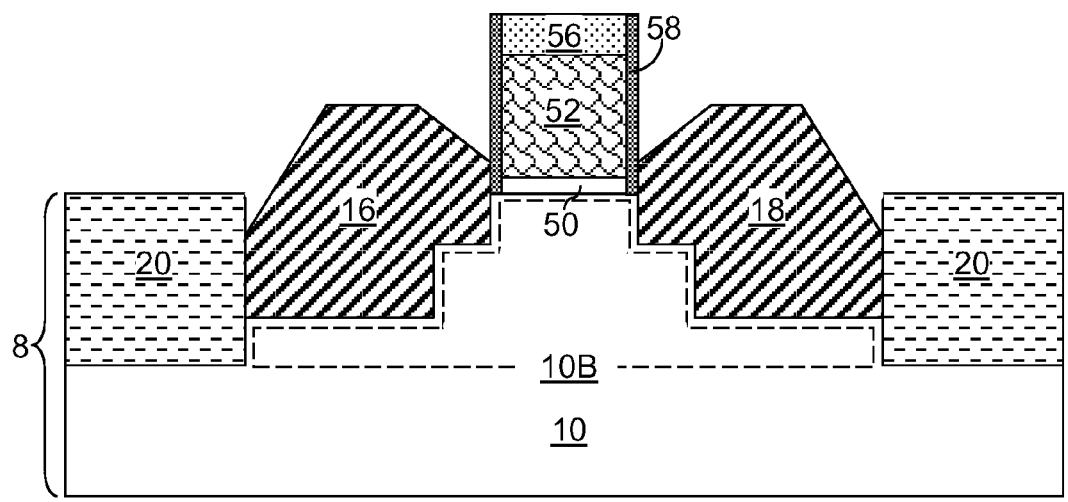
FIG. 8 is a vertical cross-sectional view of the first exemplary semiconductor structure after formation of an integrated epitaxial source and source extension region and an integrated epitaxial drain and drain extension region according to the first embodiment of the present disclosure.

Referring to FIG. 8, integrated epitaxial diffusion regions are formed. An "integrated" structure herein means a structure that includes a same material throughout and does not include any physical interface therein that has a structural discontinuity at atomic or molecular level. Thus, an integrated structure does not include any physically manifested interface such as a grain boundary or an interfacial material layer.

As used herein, an "integrated epitaxial diffusion region" refers to an integrated epitaxial source and source extension region or an integrated epitaxial drain and drain extension region. The integrated epitaxial diffusion regions include an integrated epitaxial source and source extension region 16 and an integrated epitaxial drain and drain extension region 18 are formed by filling the pair of horizontal-step-including trenches 15 with a doped semiconductor material. The integrated epitaxial source and source extension region 16 is an integrated structure that performs the function of an epitaxial source region and an epitaxial source extension region without any physically manifested interface therein. The integrated epitaxial drain and drain extension region 18 is an integrated structure that performs the function of an epitaxial drain region and an epitaxial drain extension region without any physically manifested interface therein.

The integrated epitaxial source and source extension region 16 and the integrated epitaxial drain and drain extension region 18 are formed by selective epitaxy, in which a semiconductor material is deposited only on exposed semiconductor surfaces while the semiconductor material is not deposited on dielectric surfaces. The selective epitaxy employs simultaneous or alternating steps of deposition and etch of a semiconductor material. The deposition is effected by flowing a reactant gas including a precursor for a semiconductor material in a processing chamber in which the first exemplary semiconductor structure is placed for processing.

Exemplary precursors to a semiconductor material include, but are not limited to, $SiH_4$, $Si_2H_6$, $SiH_2Cl_2$, $SiHCl_3$, $SiCl_4$, $GeH_4$, $Ge_2H_6$, and $GeH_2Cl_2$. The etch step, which can be performed simultaneously with or in alternation with the deposition step, is effected by flowing an etchant gas in the processing chamber. Exemplary etchants include, but are not limited to, HCl.

The integrated epitaxial source and source extension region 16 and the integrated epitaxial drain and drain extension region 18 are doped with electrical dopants of a second conductivity type, which is the opposite type of the first conductivity type. For example, if the first conductivity type is p-type, the second conductivity type is n-type, and vice versa. As discussed above, the single crystalline semiconductor region 10 is a semiconductor layer including a single crystalline semiconductor material of the first conductivity type, which is herein referred to a first single crystalline semiconductor material. The integrated epitaxial source and source extension region 16 and the integrated epitaxial drain and drain extension region 18 are epitaxially aligned to the single crystalline semiconductor region 10.

A pair of p-n junctions is formed at the interfaces between the single crystalline semiconductor region 10 and each of the integrated epitaxial source and source extension region 16 and the integrated epitaxial drain and drain extension region 18. Each p-n junction includes a first vertical surface extending from an bottommost portion of the outer sidewalls of the gate spacer 58 to the first depth d1 into the substrate 8, a first horizontal surface that is located at the first depth d1, a second vertical surface extending from the first depth d1 to the second depth d2, and a second horizontal surface located at the second depth d2.

An upper portion of the single crystalline semiconductor region 10 that extends to the two p-n junctions and shallow trench isolation structures 20 surrounding the integrated epitaxial source and source extension region 16 and the integrated epitaxial drain and drain extension region 18 functions as a single crystalline body region 10B.

The integrated epitaxial source and source extension region 16 is epitaxially aligned to the single crystalline body region 10B at the entirety of an interface including a first horizontal surface at the first depth d1 from a top surface of the single crystalline body region 10B, a second horizontal surface at the second depth d2 from the top surface of the single crystalline body region 10B, a first vertical surface adjoined to an outer surface of the gate spacer 58 and extending from the top surface of the single crystalline body region 10B to the first depth d1, and a second vertical surface adjoined to the first horizontal surface at an upper end and adjoined to the second horizontal surface at a lower end.

Further, the integrated epitaxial drain and drain extension region 18 is epitaxially aligned to the single crystalline body region 10B at the entirety of an interface including a third horizontal surface at the first depth d1 from a top surface of the single crystalline body region 10B, a fourth horizontal surface at the second depth d2 from the top surface of the single crystalline body region 10B, a third vertical surface adjoined to an outer surface of the gate spacer 58 and extending from the top surface of the single crystalline body region 10B to the first depth d1, and a fourth vertical surface adjoined to the third horizontal surface at an upper end and adjoined to the fourth horizontal surface at a lower end.

In one embodiment, the dopant concentration can be maintained the same during formation of the integrated epitaxial source and source extension region 16 and the integrated epitaxial drain and drain extension region 18 by performing an in-situ doping during the selective epitaxy process. In this embodiment, the entirety of the integrated epitaxial source and source extension region 16 and an entirety of the integrated epitaxial drain and drain extension region 18 have a same dopant concentration throughout.

The integrated epitaxial source and source extension region 16 and the single crystalline body region 18 may have different semiconductor materials from, or have the same semiconductor material as, the semiconductor material of the single crystalline semiconductor region 10 (except for the electrical dopants).

The exposed surfaces of the integrated epitaxial source and source extension region 16 and the integrated epitaxial drain and drain extension region 18 can include facets, which are Miller index planes of the single crystalline semiconductor materials of the integrated epitaxial source and source extension region 16 and the integrated epitaxial drain and drain extension region 18.

Figure 9:
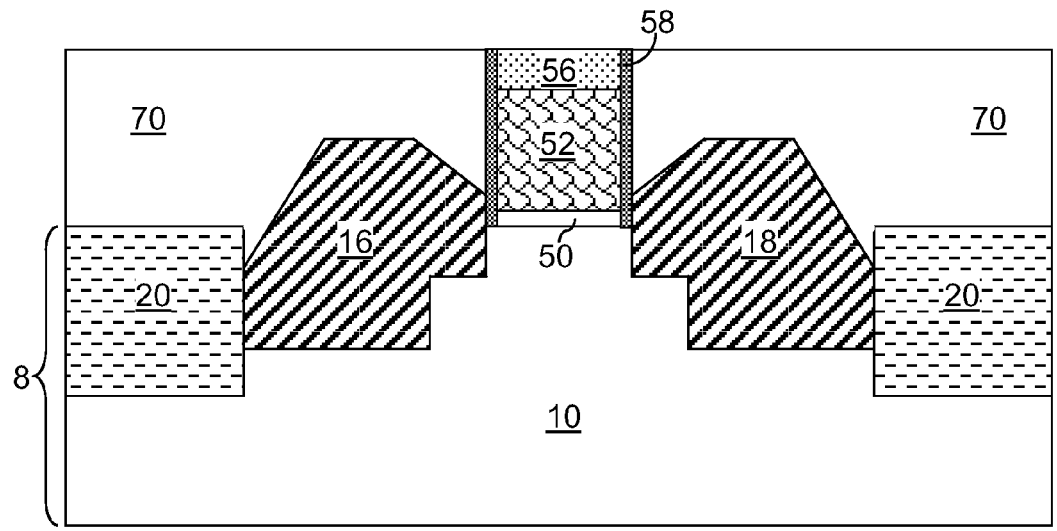
FIG. 9 is a vertical cross-sectional view of the first exemplary semiconductor structure after deposition and planarization of a planarization dielectric layer according to the first embodiment of the present disclosure.

Referring to FIG. 9, a planarization dielectric layer 70 is deposited and subsequently planarized over the integrated epitaxial source and source extension region 16 and the integrated epitaxial drain and drain extension region 18. The planarization dielectric layer 70 includes a dielectric material such as silicon oxide, silicon nitride, silicon oxynitride, organosilicate glass, or a combination thereof. The thickness of the planarization dielectric layer 70 as deposited is greater than the height of the gate structure (50, 52, 56, 58) so that the top surface of the planarization dielectric layer 70 as deposited is located above the top surface of the gate structure (50, 52, 56, 58). The planarization of the planarization dielectric layer 70 can be performed, for example, by chemical mechanical planarization (CMP) employing the gate cap dielectric 56 as a stopping layer.

Figure 10:
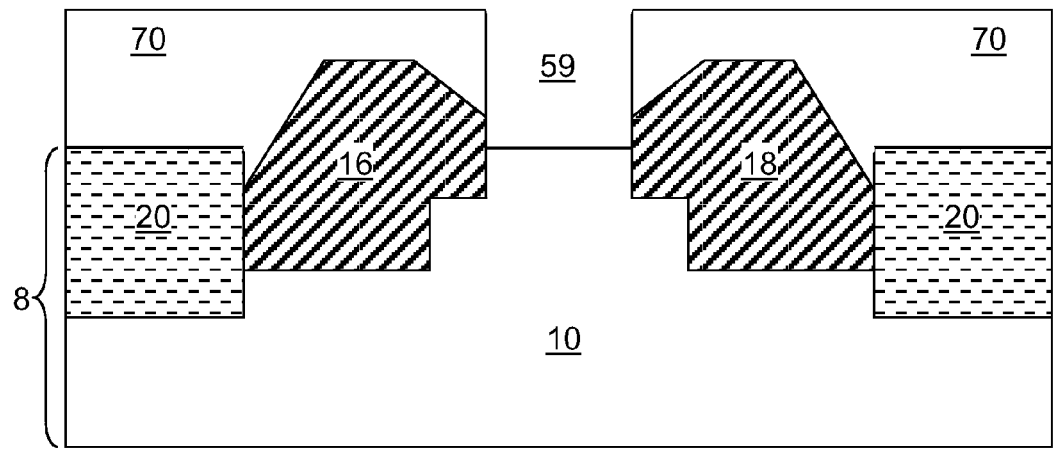
FIG. 10 is a vertical cross-sectional view of the first exemplary semiconductor structure after removal of the gate structure according to the first embodiment of the present disclosure.

Referring to FIG. 10, the gate structure (50, 52, 56, 58) is removed selective to the single crystalline semiconductor region 10 and the planarization dielectric layer 10 to form a gate cavity 59. Wet etch, dry etch, or a combination thereof can be employed to remove the various components of the gate structure (50, 52, 56, 58).

Figure 11:
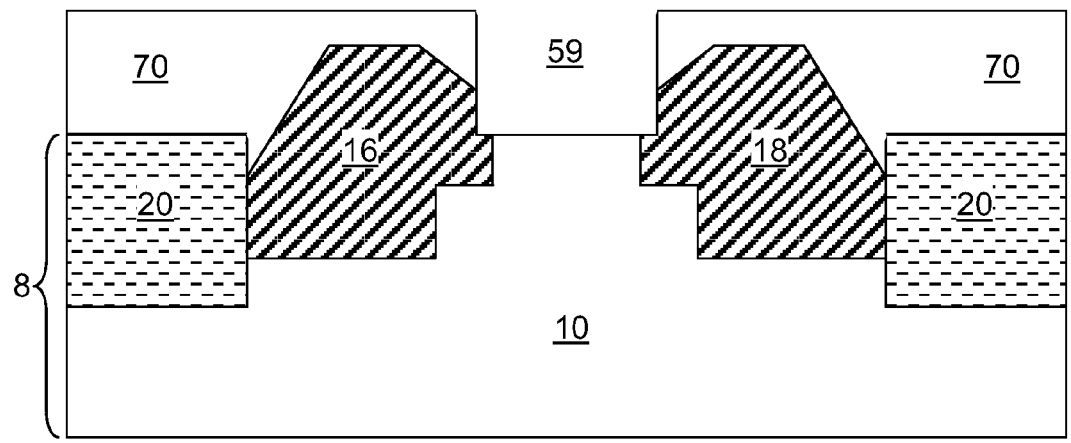
FIG. 11 is a vertical cross-sectional view of the first exemplary semiconductor structure after lateral etching of sidewalls of the planarization dielectric layer according to the first embodiment of the present disclosure.

Referring to FIG. 11, sidewalls of the planarization dielectric layer 70 and exposed portions of the integrated epitaxial source and source extension region 16 and the single crystalline body region 18 are laterally recessed employing an isotropic etch such as a wet etch. The gate cavity 59 is laterally expanded as exposed portions of the integrated epitaxial source and source extension region 16 and the integrated epitaxial drain and drain extension region 18 are removed selective to the single crystalline semiconductor region 10. Upon lateral expansion of the gate cavity 59, peripheral portions of the gate cavity 59 overlie a remaining portion of the integrated epitaxial source and source extension region 16 and a remaining portion of the single crystalline body region 18.

Figure 12:
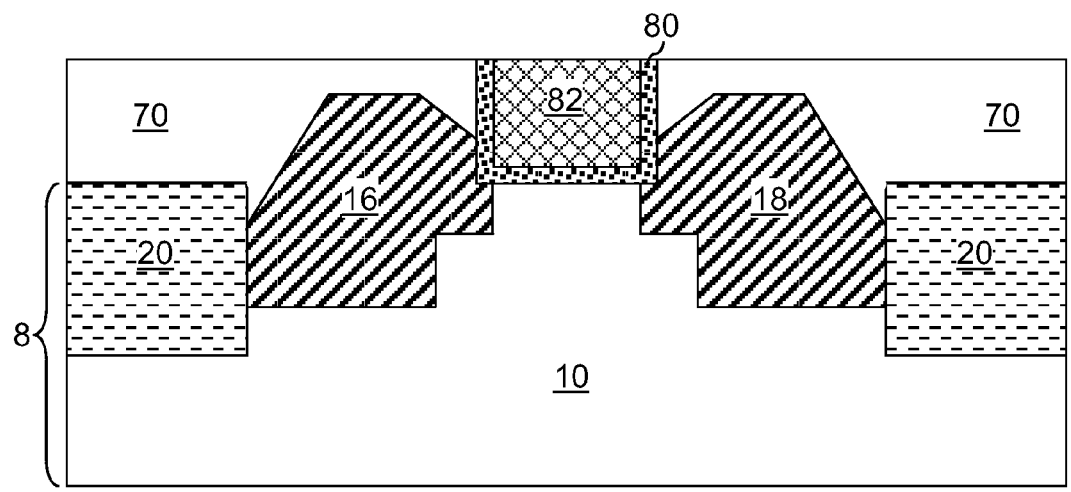
FIG. 12 is a vertical cross-sectional view of the first exemplary semiconductor structure after formation of a replacement gate structure according to the first embodiment of the present disclosure.

Referring to FIG. 12, a replacement gate structure is formed by filling the gate cavity 59 with a replacement gate dielectric layer and a replacement gate conductor layer, and by subsequently removing portions of the replacement gate dielectric layer and the replacement gate conductor layer from above the top surface of the planarization dielectric layer 70. The remaining portion of the replacement gate dielectric layer is a U-shaped gate dielectric 80, and the remaining portion of the replacement gate conductor layer is a conductive gate electrode 82. The U-shaped gate dielectric 80 and the conductive gate electrode 82 collectively constitute a replacement gate structure (80, 82).

A sidewall of the integrated epitaxial source and source extension region 16 contacts a lower portion of an outer sidewall of the U-shaped gate dielectric 80. Likewise, a sidewall of the integrated epitaxial drain and drain extension region 18 contacts a lower portion of another outer sidewall of the U-shaped gate dielectric 80. A peripheral portion of a bottom surface of the U-shaped gate dielectric 80 contacts a surface of the integrated epitaxial source and source extension region 16. Likewise, a peripheral portion of a bottom surface of the U-shaped gate dielectric 80 contacts a surface of the integrated epitaxial drain and drain extension region 18.

A vertical surface of the p-n junction between the single crystalline body region 10B (See FIG. 8) and the integrated epitaxial source and source extension region 16 is adjoined directly to a bottom surface of the U-shaped gate dielectric 80 at an upper end. Likewise, a vertical surface of the p-n junction between the single crystalline body region 10B (See FIG. 8) and the integrated epitaxial drain and drain extension region 18 is adjoined directly to the bottom surface of the U-shaped gate dielectric 80 at an upper end.

Figure 13:
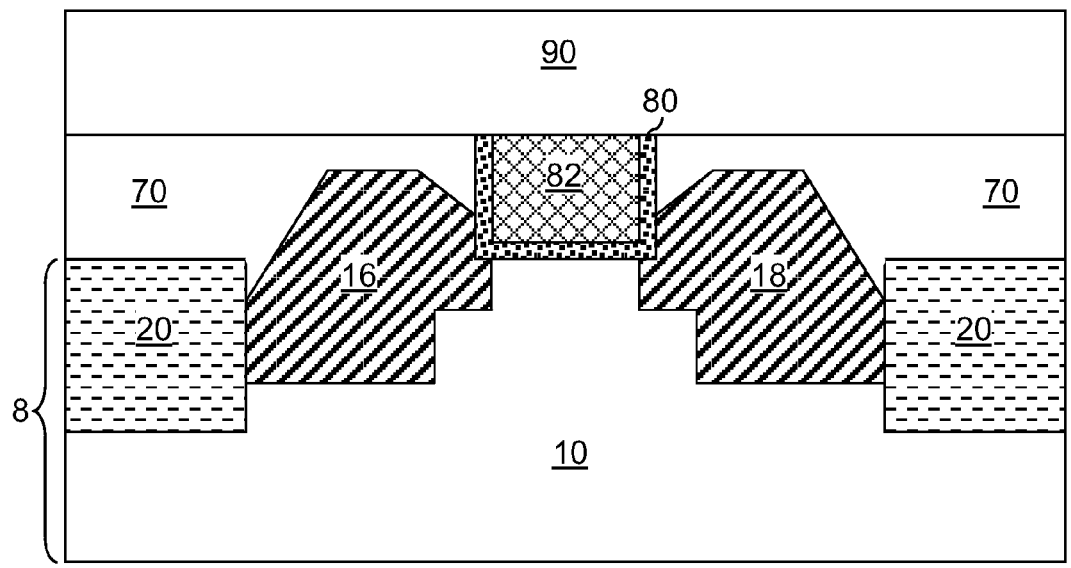
FIG. 13 is a vertical cross-sectional view of the first exemplary semiconductor structure after formation of a contact-level dielectric layer according to the first embodiment of the present disclosure.

Referring to FIG. 13, a contact-level dielectric layer 90 is formed over the planarization dielectric layer 70 and the replacement gate structure (80, 82). The contact-level dielectric layer 90 can include any material that can be employed as a dielectric material in metal interconnect structures. For example, the contact-level dielectric layer 90 can include doped or undoped silicate glass, silicon nitride, organosilicate glass, or a combination thereof.

Figure 14:
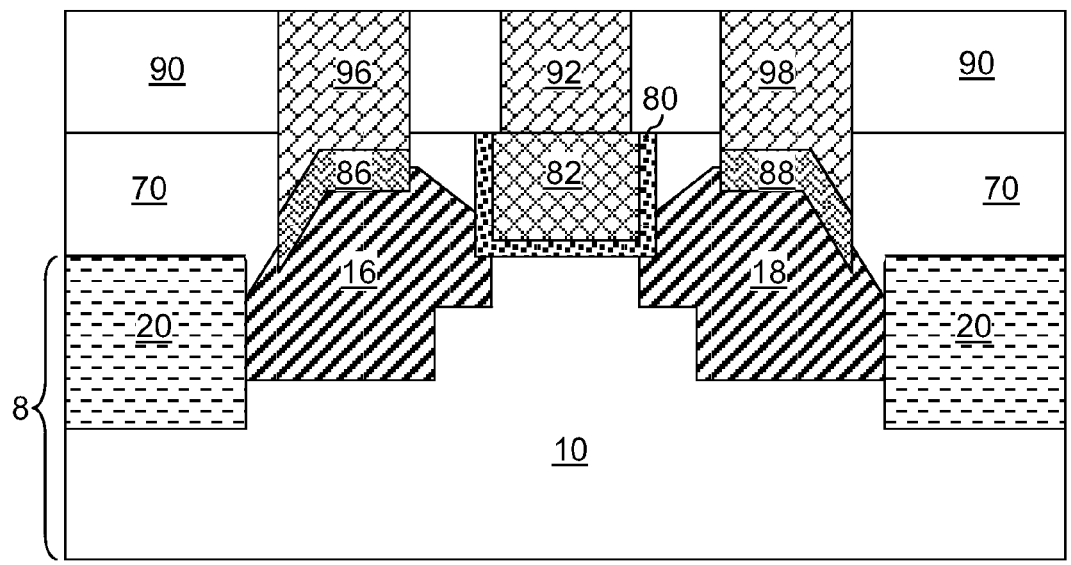
FIG. 14 is a vertical cross-sectional view of the first exemplary semiconductor structure after formation of metal-semiconductor alloy portions and contact via structures according to the first embodiment of the present disclosure.

Referring to FIG. 14, various metal-semiconductor alloy portions and contact via structures can be formed. The various metal-semiconductor alloy portions can include, for example, a source-side metal semiconductor alloy portion 86 and a drain-side metal semiconductor alloy portion 88. The various metal-semiconductor alloy portions can include a metal silicide if the integrated epitaxial source and source extension region 16 and the integrated epitaxial drain and drain extension region 18 include silicon. The contact via structures can include, for example, a source-side contact via structure 96, a drain-side contact via structure 98, and a gate-side contact via structure 92.

Figure 15:
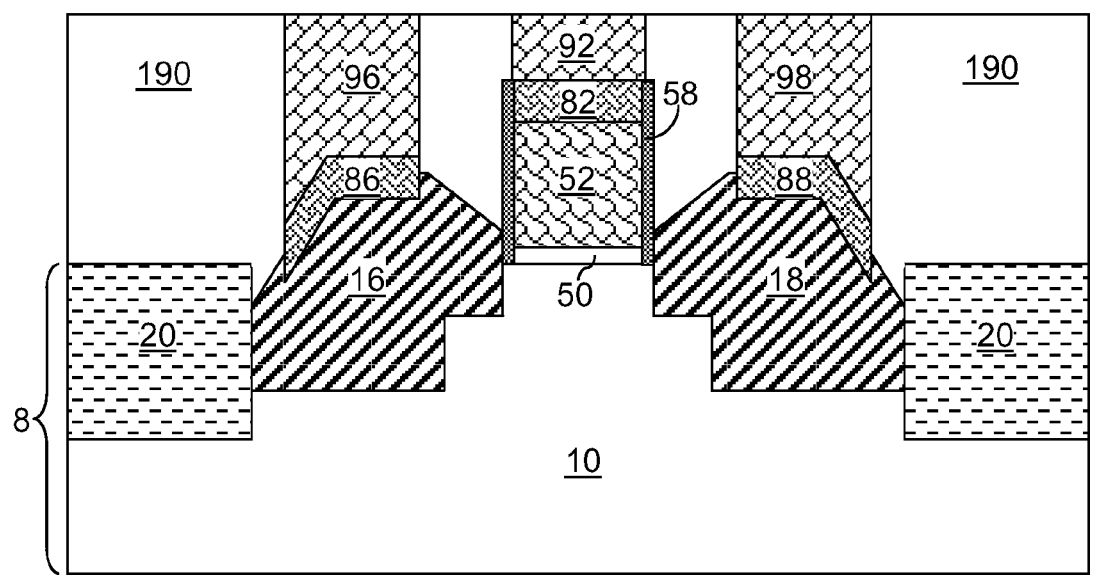
FIG. 15 is a vertical cross-sectional view of a second exemplary semiconductor structure after formation of a contact-level dielectric layer, metal-semiconductor alloy portions, and contact via structures according to a second embodiment of the present disclosure.

Referring to FIG. 15, a second exemplary semiconductor structure according to a second embodiment of the present disclosure can be derived from the first exemplary semiconductor structure of FIG. 8 by depositing and planarizing a contact-level dielectric layer 190 and forming various metal-semiconductor alloy portions and contact via structures. The various metal-semiconductor alloy portions can include, for example, a source-side metal semiconductor alloy portion 86, a drain-side metal semiconductor alloy portion 88, and a gate-side metal semiconductor alloy portion 82. The various metal-semiconductor alloy portions can include a metal silicide if the integrated epitaxial source and source extension region 16 and the integrated epitaxial drain and drain extension region 18 include silicon. The contact via structures can include, for example, a source-side contact via structure 96, a drain-side contact via structure 98, and a gate-side contact via structure 92.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure including a field effect transistor (FET), said semiconductor structure comprising:
   a single crystalline body region located in a semiconductor substrate;
   an integrated epitaxial diffusion region that is epitaxially aligned to said single crystalline body region at an interface including a first horizontal surface at a first depth from a top surface of said single crystalline body region and a second horizontal surface at a second depth from said top surface of said single crystalline body region, said second depth being greater than said first depth, wherein a p-n junction is present at said interface, a portion of said integrated epitaxial diffusion region protrudes above a horizontal plane including an interface between said single crystalline body region and a gate stack, a vertical plane including a surface of said portion of said integrated epitaxial diffusion region is more proximal to a sidewall of said gate stack than another vertical plane adjoining said first horizontal surface and said second horizontal surface is to said sidewall of said gate stack, and another portion of said integrated epitaxial diffusion region underlying said horizontal plane contacts a peripheral portion of a bottom surface of a gate dielectric of said gate stack; and
   a planarization dielectric layer overlying said integrated epitaxial diffusion region and laterally surrounding said gate stack, wherein a vertical surface of said planarization dielectric layer that is vertical throughout extends from a surface of said integrated epitaxial diffusion region to a topmost surface of said gate stack, and is vertically coincident with said vertical plane including said surface of said portion of said integrated epitaxial diffusion region.

2. The semiconductor structure of claim 1, wherein an entirety of said integrated epitaxial diffusion region has a same dopant concentration throughout.

3. The semiconductor structure of claim 2, wherein said single crystalline body region has a doping of a first conductivity type, and said integrated epitaxial diffusion region has a doping of a second conductivity type that is the opposite of said first conductivity type.

4. The semiconductor structure of claim 1, wherein said integrated epitaxial diffusion region and said single crystalline body region have different semiconductor materials.

5. The semiconductor structure of claim 1, wherein said interface between said integrated epitaxial diffusion region and said single crystalline body region further includes a vertical surface adjoined directly to said first horizontal surface at a lower end and adjoined to a bottom surface of said gate dielectric at an upper end.

6. The semiconductor structure of claim 1, wherein said gate dielectric is a U-shaped gate dielectric and said gate stack further comprises a conductive gate electrode embedded in said U-shaped gate dielectric, wherein a sidewall of said integrated epitaxial diffusion region contacts a lower portion of an outer sidewall of said U-shaped gate dielectric.

7. The semiconductor structure of claim 1, further comprising another integrated epitaxial diffusion region that is epitaxially aligned to said single crystalline body region at another interface including a third horizontal surface at said first depth from said top surface of said single crystalline body region and a fourth horizontal surface at said second depth from said top surface of said single crystalline body region.

8. The semiconductor structure of claim 7, wherein an entirety of said integrated epitaxial diffusion region and an entirety of said another integrated epitaxial diffusion region have a same dopant concentration throughout.

9. The semiconductor structure of claim 1, wherein said p-n junction is present at an entirety of said interface between said integrated epitaxial diffusion region and said single crystalline body region.

10. The semiconductor structure of claim 1, wherein said single crystalline body region includes a semiconductor material having a doping of a first conductivity type, and said integrated epitaxial diffusion region includes another semiconductor material having a doping of a second conductivity type that is the opposite of said first conductivity type, wherein said semiconductor material contacts said another semiconductor material at said first horizontal surface and at said second horizontal surface.

11. The semiconductor structure of claim 10, wherein said semiconductor material contacts said another semiconductor material at an entirety of said interface between said integrated epitaxial diffusion region and said single crystalline body region.

12. The semiconductor structure of claim 1, wherein a non-vertical surface of said planarization dielectric layer is in physical contact with a top surface of said integrated epitaxial diffusion region.

13. The semiconductor structure of claim 1, wherein said planarization dielectric layer is in physical contact with a shallow trench isolation structure embedded in said semiconductor substrate.

14. The semiconductor structure of claim 1, further comprising a metal-semiconductor alloy portion in contact with surfaces of said integrated epitaxial diffusion region.

* * * * *